United States Patent
MacNaughton et al.

(10) Patent No.: US 9,588,441 B2
(45) Date of Patent: Mar. 7, 2017

(54) METHOD AND DEVICE FOR USING SUBSTRATE GEOMETRY TO DETERMINE OPTIMUM SUBSTRATE ANALYSIS SAMPLING

(75) Inventors: Craig W. MacNaughton, Los Gatos, CA (US); Jaydeep K. Sinha, Livermore, CA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 137 days.

(21) Appl. No.: 13/475,402

(22) Filed: May 18, 2012

(65) Prior Publication Data
US 2013/0310966 A1 Nov. 21, 2013

(51) Int. Cl.
*G05B 11/01* (2006.01)
*G03F 7/20* (2006.01)
*G05B 19/418* (2006.01)
*H01L 21/67* (2006.01)

(52) U.S. Cl.
CPC ...... *G03F 7/70616* (2013.01); *G03F 7/70525* (2013.01); *G03F 7/70633* (2013.01); *G05B 19/41875* (2013.01); *H01L 21/67288* (2013.01)

(58) Field of Classification Search
None
See application file for complete search history.

(56) References Cited

U.S. PATENT DOCUMENTS

| | | | |
|---|---|---|---|
| 4,750,141 A | 6/1988 | Judell et al. | |
| 5,134,303 A | 7/1992 | Blach et al. | |
| 5,248,889 A | 9/1993 | Blach et al. | |
| 5,757,673 A | 5/1998 | Osheiski et al. | |
| 5,898,106 A | 4/1999 | Babcock | |

(Continued)

FOREIGN PATENT DOCUMENTS

| | | |
|---|---|---|
| JP | 9326349 | 12/1997 |
| JP | 2001332609 | 11/2001 |

(Continued)

OTHER PUBLICATIONS

D.K, Bowen, B.K, Tanner "High Resolution X-ray Diffractometry and Topography", (1998), CRCPress ISBN D-8506-6758-5), Chapter 1, pp. 1-13.

(Continued)

*Primary Examiner* — Sean Shechtman
(74) *Attorney, Agent, or Firm* — Joshua D. Isenberg; JDI Patent

(57) ABSTRACT

A method and apparatus for process control in the processing of a substrate is disclosed in the present invention. Embodiments of the present invention utilize a first analysis tool to determine changes in a substrate's geometry. The substrate geometry data is used to generate sampling plan that will be used to check areas of the substrate that are likely to have errors after processing. The sampling plan is fed forwards to a second analysis tool that samples the substrate after it has been processed. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

38 Claims, 4 Drawing Sheets

(56) References Cited

U.S. PATENT DOCUMENTS

| | | | |
|---|---|---|---|
| 5,912,738 | A | 6/1999 | Chason et al. |
| 6,023,338 | A | 2/2000 | Bareket |
| 6,031,611 | A | 2/2000 | Rosakis et al. |
| 6,100,977 | A | 8/2000 | Muller |
| 6,118,185 | A | 9/2000 | Chen et al. |
| 6,130,750 | A | 10/2000 | Ausschnitt et al. |
| 6,503,767 | B2 | 1/2003 | Korovin |
| 6,766,214 | B1 | 7/2004 | Wang et al. |
| 6,847,458 | B2 | 1/2005 | Freischlad et al. |
| 6,859,746 | B1 | 2/2005 | Stirton |
| 6,883,158 | B1 | 4/2005 | Sandstrom et al. |
| 6,912,435 | B2 | 6/2005 | Pellegrin et al. |
| 6,921,916 | B2 | 7/2005 | Adel et al. |
| 6,985,618 | B2 | 1/2006 | Adel et al. |
| 7,161,669 | B2 | 1/2007 | Velidandla et al. |
| 7,184,853 | B2 | 2/2007 | Roberts et al. |
| 7,363,099 | B2* | 4/2008 | Smith et al. ................ 700/121 |
| 7,442,908 | B2 | 10/2008 | Schuster |
| 7,519,447 | B1* | 4/2009 | Bode et al. ................ 700/110 |
| 8,065,109 | B2 | 11/2011 | Veeraraghavan et al. |
| 8,111,376 | B2 | 2/2012 | Adel |
| 2002/0006740 | A1* | 1/2002 | Kamieniecki et al. ....... 438/795 |
| 2004/0044431 | A1 | 3/2004 | Pellegrini et al. |
| 2004/0121495 | A1 | 6/2004 | Sonderman |
| 2005/0084987 | A1* | 4/2005 | Wilson .................. C23C 14/545 438/5 |
| 2005/0136346 | A1 | 6/2005 | Ottens et al. |
| 2005/0243294 | A1 | 11/2005 | Smith et al. |
| 2005/0278126 | A1 | 12/2005 | Rosakis et al. |
| 2006/0038980 | A1 | 2/2006 | Naka et al. |
| 2006/0114436 | A1 | 6/2006 | Oesterholt |
| 2006/0166453 | A1* | 7/2006 | Lin .................... G03F 7/70633 438/377 |
| 2006/0265686 | A1 | 11/2006 | Ikeda |
| 2007/0021860 | A1 | 1/2007 | Gertrudus Simons et al. |
| 2007/0212856 | A1* | 9/2007 | Owen ........................... 438/478 |
| 2008/0286885 | A1 | 11/2008 | Izikson et al. |
| 2010/0036518 | A1* | 2/2010 | Funk et al. ................ 700/121 |
| 2010/0055908 | A1* | 3/2010 | Roettger et al. ............. 438/692 |
| 2010/0129939 | A1* | 5/2010 | David et al. ...................... 438/8 |

FOREIGN PATENT DOCUMENTS

| | | |
|---|---|---|
| JP | 2005191569 | 7/2005 |
| JP | 2005233928 | 9/2005 |
| JP | 2006157014 | 6/2006 |
| JP | 2006278767 | 10/2006 |
| JP | 2007027721 | 2/2007 |
| JP | 2007535170 | 11/2007 |
| JP | 2009529785 | 8/2009 |
| WO | 2007006085 | 1/2007 |

OTHER PUBLICATIONS

G. Turrell and J. Corset (Eds.), Raman Microscopy, pp. 275-277 (1996) Academic Press, ISBN 0-12-189690-0).

Neal T. Sullivan, "Semiconductor Pattern Overlay". Handbook of Critical Dimensions Metrology and Process Control, pp. 160-188, vol. CR52. SPIE Press (1993).

Gary Zhang et al., "Across Wafer Focus Mapping and Its Applications inAdvanced Technology Nodes", Optical Mlcrollthography XIX. edited by Donis G. Flagello, Proc. of SPIE, vol. 6154,10pages.

PCT Search Report and Written Opinion for PCT App. No. PCT/US2013/041169, dated Feb. 10, 2014.

PCT Invitation to Pay Additional Fees for International Application No. PCT/US2013/041169 dated Nov. 6, 2013.

Korczynski, Ed. "KLA-Tencor's WaferSight2 Sees Wafer Nanotopo." Solid State Technology, Dec. 10, 2007. Web. Feb. 3, 2014.

Osborne, Mark. "New Product: KLA-Tencor Combines Bare Wafer Flatness, Shape, Edge Roll-off and Nano-topography in 1." Fabtech, Dec. 3, 2007. Web. Feb. 3, 2014.

* cited by examiner

METHOD AND DEVICE FOR USING SUBSTRATE GEOMETRY TO DETERMINE OPTIMUM SUBSTRATE ANALYSIS SAMPLING

FIELD OF THE INVENTION

Embodiments of this invention generally relate to substrate processing and more particularly to process control in substrate processing.

BACKGROUND OF THE INVENTION

Tighter layer to layer device overlay tolerances are needed in substrate processing (e.g., semiconductor device wafer processing) in order to meet device performance requirements and maximize the device yield. As circuit densities increase and device sizes decrease, pattern overlay is becoming one of the most significant performance issues during development of semiconductor process technology.

The manufacture of modern integrated circuit chips requires many different patterns to be layered one on another. Each new pattern has to be accurately registered with patterns already on the chip. The patterning tool (e.g., a scanner or stepper) that prints the pattern on the wafer contains subsystems that measure the location, height and tilt of the existing pattern. The time available to make these measurements is limited because these measurements have to be done while the previous wafer is being exposed (or otherwise processed). Consequently, the number of measurements that can be made during such time is limited.

According to the 2005 ITRS roadmap, at the 32-nm node, the overall budget for overlay accuracy on critical layers is expected to be approximately 5.7 nm 3σ. Scanners do adjust the leveling and alignment of each individual die before printing, but the leveling only corrects for average slopes in the X and Y directions (e.g., a tilted wafer plane) and not for vertical distortions on scale lengths shorter than a die. The alignment only compensates for some of the errors, but not all. To save time and improve throughput, scanners often perform alignment using some sample subset of the total number of die on a wafer, e.g., about 30 out of 150.

Complex distortions of the shape of the wafer in X, Y, and Z due to the non-uniform changes in geometry from previous processing steps are not adequately accounted for by the patterning tool. This tends to create regions of the wafer where yield is low due to poor alignment of one pattern with earlier patterns on chips in that area of the wafer. It is therefore necessary to inspect the wafers after patterning with a post-process analysis tool to ensure that the alignment is satisfactory.

One such type of metrology used is overlay metrology. Extensive technical literature can be found describing many different optical, algorithm and mark architectures which are relied on for this purpose. The current state of the art is, for example, the KLA-Tencor Archer 100 overlay metrology tool, which operates on the principle of high resolution bright field imaging of either box-in-box or periodic (AIM) two-layer metrology structures. With a box-in-box structure, the displacement between the centers of symmetry of two or more features, sequentially generated in a number of patterning steps is calculated by image processing of images acquired through a microscope and stored digitally. This technique is further described and analyzed by Neal T. Sullivan, "Semiconductor Pattern Overlay", in Handbook of Critical Dimensions Metrology and Process Control, pp. 160-188, vol. CR52, SPIE Press (1993). Variations on such box-in-box structures are also described in U.S. Pat. Nos. 6,118,185 and 6,130,750, the disclosures of both of which are incorporated herein by reference.

A known alternative to the box-in-box technique is known as scatterometry overlay. In this technique, information is extracted from the intensity of light reflected from a periodic overlay mark. The overlay mark consists of gratings printed over gratings in subsequent patterning steps. In this approach, several overlay cells, with different intentional offsets between the two gratings of each cell, are formed in close proximity. The difference between the intensities of light scattered from these overlay marks allows a model-free determination of the overlay error. Such grating style targets (sometimes referred to as "AIM" marks) can be denser and more robust, than "box" or ring-type marks resulting in the collection of more process information, as well as target structures that can better withstand the rigors of chemical mechanical planarization (CMP). The use of such marks is described, e.g., by Adel et al. in commonly assigned U.S. Pat. Nos. 6,023,338, 6,921,916 and 6,985,618, all three of which are incorporated herein by reference for all purposes.

Overlay tools often use a mathematical model of the overlay process that takes into account errors caused by the scanner. There are two methodologies. One is to use data from the overlay tool to calculate higher order correctables and feed that back to the scanner. The other is for the scanner to calculate higher order correctables at alignment and use that to improve the model and improve overlay. Some examples of higher order shape correctables and how they are determined are described, e.g., in commonly-assigned U.S. Pat. No. 8,065,109 to Sathish Veeraraghavan et al., which is incorporated herein by reference. The higher order correctables calculated by the overlay tool may be subtracted from the overlay measurement data and the resulting values, known as residuals, provide a measure of how well the model used to calculate the correctables accounts for actual overlay errors.

Testing every die on a wafer is time consuming. As a result not all dies can be tested and a sampling plan must be created. The goal of a sampling plan is to identify the areas that are most likely to have problems with the alignment. The prior art method of generating a sampling plan includes sampling every die on a wafer and multiple wafers per lot for a given layer. The areas on the die that show the highest residuals over the entire sample set are then incorporated into a sampling plan that is then used for each subsequent wafer. The sampling plan is selected such that it optimizes the ability to calculate overlay residual errors and provide reasonable tool throughput and wafer cycle time. For example, a five point plan may select a die at the center of a wafer and die at four evenly spaced compass points about two thirds of the way out from the center. For a nine point plan, die located on diagonals may be added.

FIG. 1A depicts a typical sample plan that tests 24 fields per wafer for current 3X/2X nm nodes. The wafer 100 is divided into multiple dies 104. Out of all of the dies 104 on the wafer 100 only 24 dies are selected for further analysis. These 24 sample locations 105 are strategically spaced over the wafer such that they coincide with the areas that have shown the highest overlay residuals in the initial test wafers. This sampling plan is then used for all subsequent lots and only updated if significant overlay errors are seen in production.

However, it is understood in the art that overlay residual errors are often caused by changes in the wafer geometry. The wafer geometry caused by previous processes will change over time and these changes may occur in areas of the wafer that are not sampled in the original sampling plan. FIG. 1B provides a topographical map of the wafer geometry of a subsequent wafer 101 overlaid on the original sampling plan. By way of example and not by way of limitation, instead of using absolute measures of substrate geometry, FIG. 1B may also represent the change in geometry between a previous layer and the current layer (i.e., the delta of two geometry measurements on the same substrate). When matched up against the static sampling plan it is evident that there will be several areas where overlay residual errors are likely to occur, but will not be detected by the static sampling plan. For example, at location 107 there is a contour line between two regions. However, under the static sampling plan, there is no sample 105 taken anywhere along the contour. Also, at location 108 there is a steep slope from the largest increase in elevation to the largest decrease in elevation over a little over the length of one die. With such a large change in geometry over such a small area, location 108 would ideally have more than one sample 105. The areas of greater change in geometry are likely sources of overlay residual errors, but they are not guaranteed to be checked. Only by chance will areas like location 106 have adequate sampling. Without checking these problem areas, many lots may pass through with only marginal overlay. These overlay problems may produce the need for significant amounts of rework, or even scrap.

Thus, there is a need in the art for a method and an apparatus that are capable of generating a dynamic sampling plan that targets areas of individual wafers that are predicted to have marginal overlay.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Figure 1A:
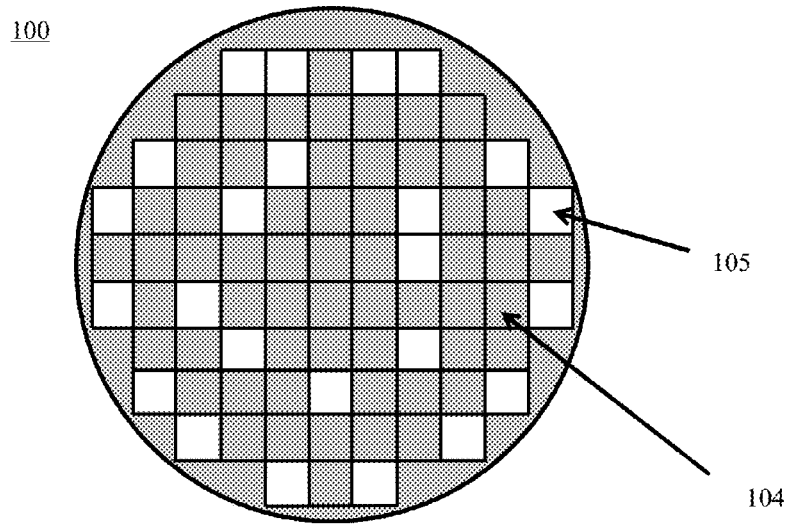
FIG. 1A is an overhead view of a prior art embodiment of a static sampling plan used to detect overlay residual errors.
Figure 1B:
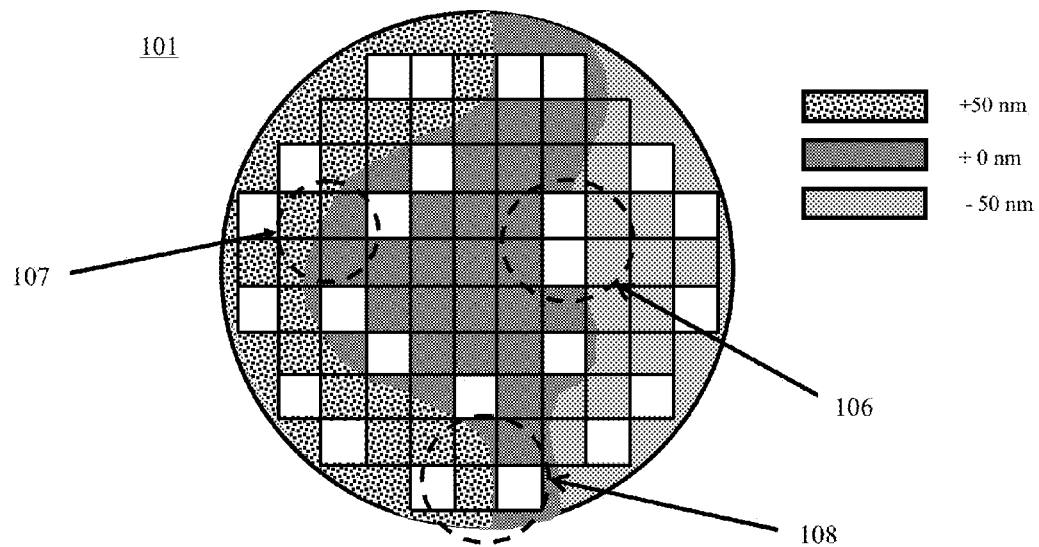
FIG. 1B is an overhead view of a prior art embodiment of a static sampling plan overlaid on a topographical map of a wafer.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following description, reference is made to the accompanying drawings, which form a part hereof, and in which is shown by way of illustration specific embodiments in which embodiments of the invention may be practiced. In this regard, directional terminology, such as "top," "bottom," "front," "back," "leading," "trailing," etc., is sometimes used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of the present invention include a method and an apparatus for process control in a lithographic patterning process. Analysis of the substrate may be performed on a substrate before performing a lithographic patterning process on the substrate with a first analysis tool. A sampling plan may be generated based on the metrology. The sampling plan may then be sent to a second analysis tool which is capable of implementing the revised sampling plan on the patterned substrates.

Embodiments of the present invention include a method and an apparatus for process control in a polishing process. Analysis, e.g., metrology, inspection, or review may be performed on a substrate before performing a polishing process on the substrate. A sampling plan may be generated based on the analysis. The sampling plan may then be sent to a post process analysis tool which is capable of implementing the revised sampling plan on the patterned substrates.

Embodiments of the present invention utilize various types of substrate geometry information fed forward from a pre-process analysis tool to a post-process analysis tool in order to enhance die yield in semiconductor device manufacture. The sampling plan may be configured to allow higher order correctables to have the least residuals. By automatically adjusting the sampling pattern to sample the processed substrate more densely in areas of large changes in the substrate geometry, the maximum yield may be obtained from each substrate even when the substrate geometry resulting from a given process changes over time or is non-uniform across the substrate. Additionally, improved sampling will allow better calculation of higher order correctables and therefore will reduce overlay errors.

Unlike the prior art, embodiments of the present invention utilizes substrate geometry information calculated by a pre-process analysis tool to generate a sampling plan. The sampling plan is generated by identifying the areas of the substrate that exhibited a greater degree of geometry change. These areas of greater change are then selected to be sampled more densely by a post-process analysis tool. The sampling plan is then fed forwards to the post-process analysis tool which uses the sampling plan to make measurements, e.g., measurements of overlay errors, at selected portions of the wafer according to the sampling plan.

The prior art, by contrast, relies on a static sampling plan. The static sampling plan is created by using a post-process analysis tool to measure each die on a selected substrate from a subset of multiple substrates per lot for a given layer. The areas on the die that show the highest residuals over the entire sample set are then incorporated into the static sampling plan. This sampling plan is then used for all subsequent lots and only updated if significant overlay errors are seen in production. Unlike embodiments of the present invention, such static sampling plans fail to dynamically adjust to changes in substrate geometry that can develop over the period of processing multiple lots of substrates. As such, if the changes in substrate geometry occur in areas where there is no sampling, then overlay errors will not be detected. Therefore, static sampling plans may result in many lots passing inspection with only marginal or even out of spec overlay.

Figure 2:
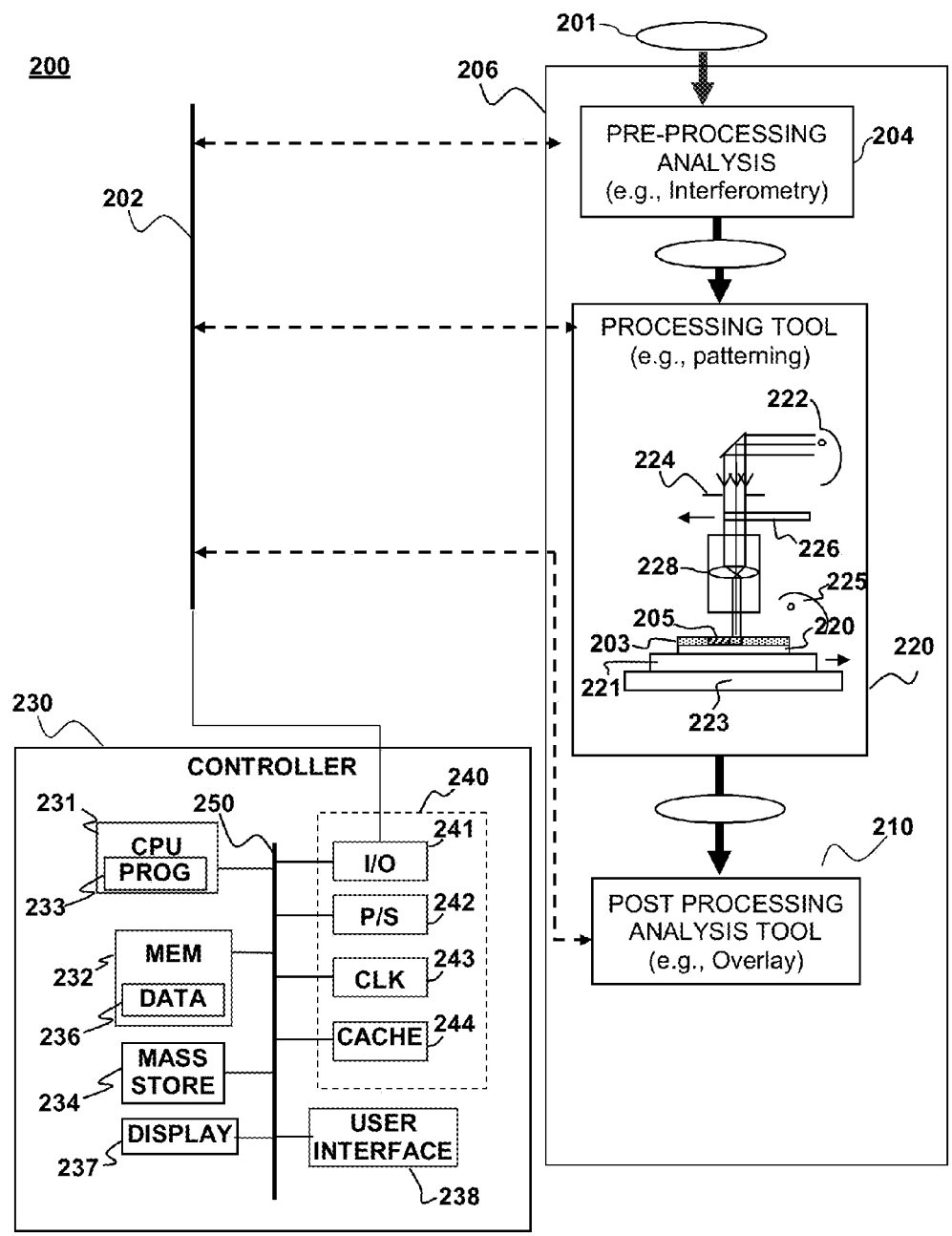
FIG. 2 is a block diagram of a semiconductor substrate processing system according to an embodiment of the present invention.

FIG. 2 illustrates an apparatus 200 according to an embodiment of the present invention. The apparatus 200 includes at least one semiconductor processing tool 220, a pre-processing analysis tool 204, a post-processing analysis tool 210 and a controller 230. The processing tool 220, the pre-processing analysis tool 204 and the post-processing analysis tool 210 may reside in a common chamber 206. Substrates 201 undergo fabrication-related processing in the processing tool 220. The substrates may be transferred among the processing tool 220 and analysis tools 204, 210, e.g., using substrate handling robots or automated materials handling system or some combination of both. By way of example and not by way of limitation, the substrates may be semiconductor substrates. The pre-processing analysis tool 204 analyzes the substrates 201 before the fabrication-related processing by processing tool 220 in order to generate measures of substrate geometry. By way of example, the measures of substrate geometry may represent the change in geometry between a previous layer and the current layer (i.e., the delta of two geometry measurements on the same substrate), or it may be an absolute measure of the geometry. The controller 230 may use information from the pre-processing analysis tool 204 to provide feed forward control of the post-processing analysis tool 210. The processing tool 220, analysis tools 204, 210 and controller 230 may communicate with each other through a data bus 202.

As used herein, the term "analysis tool" is intended to cover tools used to perform measurements on a substrate before, during, after or between substrate processing steps. Analysis tools may be categorized into subclasses, including, but not limited to metrology tools, inspection tools, and review tools.

A metrology tool is generally configured to perform an analysis by making measurements and providing outputs that correspond to the value of some physical property. The value output is typically a numerical value or set of numerical values, which may be transmitted or stored in analog or digital form. Examples of metrology tools include, but are not limited to overlay tools, interferometers, critical dimension (CD) tools (e.g., CD scanning electron microscope (CD-SEM)), film thickness tools, ion implant metrology tools, surface profiling tools, resistivity metrology tools, reticle pattern placement metrology tools, edge metrology tools, reflectometers, and ellipsometers.

Specific examples of commercially available overlay metrology tools include the Archer series overlay tools from KLA-Tencor Corporation of Milpitas, Calif.

Examples of optical CD metrology tools include SpectraShape optical CD tools from KLA-Tencor Corporation of Milpitas, Calif.

Examples of optical film thickness/refractive index/stress metrology tools include Aleris family, ASET-F5x, and SpectraFx tools from KLA-Tencor Corporation of Milpitas, Calif.

Examples of metrology tools for measuring wafer geometry and topography include WaferSight tools from KLA-Tencor Corporation of Milpitas, Calif. In addition, the SURFmonitor module for Surfscan SPx series tools from KLA-Tencor can indicate sub-angstrom surface topography variation on blanket films and bare substrates.

Examples of ion implant metrology tools include ThermaProbe tools from KLA-Tencor Corporation of Milpitas, Calif.

Examples of surface profiling metrology tools include HRP-x50 automated stylus-based surface profilers from KLA-Tencor Corporation of Milpitas, Calif.

Examples of resistivity metrology tools include RS-x00 sheet resistance mapping tools from KLA-Tencor Corporation of Milpitas, Calif.

Examples of reticle pattern placement metrology tools include IPRO Series tools from KLA-Tencor Corporation of Milpitas, Calif.

Examples of edge metrology tools include VisEdge Family tools from KLA-Tencor Corporation of Milpitas, Calif.

An inspection tool is generally configured to look for defects, i.e., something that is out of the ordinary. Typical output of an inspection tool is a count of defects per area for a substrate or portion of a substrate. Examples of inspection tools include, but are not limited to optical and electron beam wafer inspection systems for patterned or unpatterned wafers, macro defect inspection tools, edge defect inspection tools, infrared inspection tools, and reticle inspection tools.

Specific examples of commercially available inspection tools include, but are not limited to the following.

Optical wafer inspection tools for patterned wafers include 28XX series and 29XX series broadband optical defect inspection tools and Puma series laser-based optical defect inspection tools and the 8900 high-speed brightfield/darkfield optical defect inspection system; all of which are available from KLA-Tencor Corporation of Milpitas, Calif.

Electron beam wafer inspection tools for patterned wafers include the eS800 electron beam defect inspection system from KLA-Tencor Corporation of Milpitas, Calif.

Optical wafer inspection tools for unpatterned wafers include the Surfscan SPx and series and SURFmonitor (SURFmonitor is an option on an SPx tool) wafer defect inspection tools from KLA-Tencor Corporation of Milpitas, Calif.

Examples of edge defect inspection tools include VisEdge family tools from KLA-Tencor Corporation of Milpitas, Calif.

Examples of macro defect inspection tools include LDS infrared defect inspection tools and review station from KLA-Tencor Corporation of Milpitas, Calif.

Examples of infrared defect inspection tools include IRIS infrared defect inspection tools and review station from KLA-Tencor Corporation of Milpitas, Calif.

Examples of reticle inspection tools include TeraFab series Photomask inspection tools from KLA-Tencor Corporation of Milpitas, Calif.

Inspection tools may also be configured for back end of line (BEOL) inspection of fabricated devices. Examples of BEOL inspection tools include, but are not limited to, component inspection tools configured to inspect various semiconductor components that are handled in a tray, such as microprocessors or memory chips. Component defect inspection tool capabilities include, but are not limited to: 3D coplanarity inspection; measurement of the evenness of the contacts; and 2D surface inspection to check the package's surface aspects, the identification mark and the orientation. BEOL inspection tools may also be configured to inspect diced or undiced wafers, or diced wafers mounted on film frame carriers. Such tools may be configured to inspect surface quality of the wafers, the quality of the wafer cutting, or wafer bumps.

Commercially available examples of BEOL inspection tools include, but are not limited to component inspectors, such as the ICOS CI-T620, ICOS CI-T120/CI-T130, ICOS CI-T120S/CI-T130S, and ICOS CI-3050 model tools from KLA-Tencor Corporation of Milpitas, Calif.

A review tool is generally configured to take the output of a metrology or inspection tool and investigate further. For review of metrology, the review tool may be configured to investigate why the value is different. For inspection the review tool may be configured to investigate the nature of defects discovered by an inspection tool. Examples of review tools include electron beam, optical, or infrared review tools. Examples of electron beam review tools include the eDR-7000 series SEM-based defect review and classification systems from KLA-Tencor Corporation of Milpitas, Calif. Examples of optical review tools include INX-3x00 series automated, full-spectrum optical review systems from KLA-Tencor Corporation of Milpitas, Calif. Examples of infrared review tools include the IRIS infrared inspection and review station from KLA-Tencor Corporation of Milpitas, Calif.

It is noted that some tools can implement both metrology and review functions, some can implement review and inspection functions, some can implement metrology and inspection functions, and some can implement all three functions. Therefore, it is possible for two or more of these functions to be implemented by the same type of tool or, in some cases, the same tool.

By way of example, and without limitation of embodiments of the invention, the pre-processing analysis tool 204 may include an interferometer configured to measure wafer topography. The pre-processing analysis tool may concurrently measure topography of both front and back surfaces of the substrate. A commercially available example of such a tool is a WaferSight 2 system from KLA-Tencor Corporation of San Jose, Calif. Alternatively, the pre-processing analysis tool 204 may use electric sensors, such as capacitive sensors, that can measure variations in substrate height. By way of non-limiting example, and without loss of generality, the pre-processing analysis tool may be an optical metrology tool that uses focus-based z-height metrology. An example of such a tool is a Spectra Fx 200 optical thin film metrology system from KLA-Tencor Corporation of San Jose, Calif. In some implementations, focus-based z-height metrology may be combined with optical triangulation to calculate tilt. Alternatively, the pre-processing analysis tool 204 may be an optical thin film metrology system based on spectroscopic ellipsometry.

The pre-process analysis tool is used to produce substrate geometry information. By way of example and without limitation, substrate geometry information includes higher order shape characteristics such as site flatness, site nanotopography, edge roll off, and warp. By way of example, the measures of substrate geometry may represent the change in geometry between a previous layer and the current layer (i.e., the delta of two geometry measurements on the same substrate), or it may be an absolute measure of the geometry. The substrate may be held vertically at only a few points by finger-like pincers to avoid distortion of the shape of the wafer that would occur if the wafer were chucked.

As noted above, some examples of higher order shape correctables and how they are determined are described, e.g., in commonly-assigned U.S. Pat. No. 8,065,109 to Sathish Veeraraghavan et al., which has been incorporated herein by reference. In addition, other higher order shape correctables may be determined in accordance with known measurement standards. For example, site flatness may generally be determined by using the standard set forth in SEMI MF1530. Site flatness is the deviation of the front surface of the substrate relative to a specified reference plane when the back surface of the substrate is ideally flat, as when pulled down by vacuum onto an ideally clean flat chuck. Site nanotopography may be determined according to the SEMI M43 standard and is defined as the non-planar deviation of the whole front wafer surface within a spatial wavelength range of approximately 0.2 to 20 mm and within the fixed quality area (FQA). Typical examples of site nanotopography include dips, bumps or waves on the wafer surface that vary in peak to valley height from a few nanometers to a several hundred nanometers. Edge roll-off (ERO) is the surface deviations of a large-diameter silicon wafer near the edge, but excluding effects due to wafer edge profiling and surface roughness. ERO may be determined according to the SEMI M69-0307 (Provisional) standard. Warp may be measured according to the SEMI MF1390 standard and is defined as the difference between the maximum and minimum distances of the median surface of a free, unclamped wafer from a reference plane.

By way of example, and without limitation of embodiments of the invention, the post-processing analysis tool 210 may include an overlay tool, a thin film tool, such as a spectroscopic ellipsometer, an electron beam tool such as a critical dimension scanning electron microscope (CD-SEM), or scatterometry tool or any of the other tools listed above. By way of example, and without loss of generality, the post-processing analysis tool 210 may be an optical microscopy tool. By way of example, and without loss of generality, the post-processing analysis tool 210 may be a thin film metrology tool. Examples of such tools include optical thin film metrology tools, such as ellipsometer-, scatterometer- and interferometer-based tools or other tool listed above. By way of example, the post-process analysis tool 210 may be an Archer 300 LCM Overlay and Lithography CD Metrology Systems system from KLA-Tencor Corporation of San Jose, Calif.

The processing tool 220 may be of any of a number of different types of tools used to perform various fabrication processes on the substrate. Examples of such processes include, but are not limited to patterning, etching, material deposition, resist stripping, cleaning, polishing, ion implantation, annealing.

By way of example, and without limitation of embodiments of the invention, the processing tool 220 may generally include a lithographic patterning tool 220 such as a scanner or stepper developer. Such developers are similar in operation to a slide projector or a photographic enlarger. Such tools are often used in photolithographic processes used to form microscopic circuit elements on the surface of a semiconductor wafer. In the pattering tool, the substrate is retained on a stage 221, which may include a chuck, e.g., a vacuum chuck or an electrostatic chuck. Elements of a circuit or other component to be created on the IC are reproduced in a pattern of transparent and opaque areas on the surface of a photomask or reticle 226. The pattern on the reticle 226 often corresponds to a pattern for a single die or chip. Light from a source 222 passes through the reticle 226 and forms an image of the reticle pattern. The image is focused and sometimes reduced by a lens 228, and projected onto the surface of a substrate 201 that is coated with a photoresist 203. The focused image on the resist 203 is often referred to as an exposure field 205. After exposure, the coated substrate 201 may be chemically developed, causing the photoresist 203 to dissolve in certain areas according to the amount of light the areas received during exposure. This transfers the pattern on the reticle 226 to the resist 203. The patterning tool 220 may be equipped with heater elements 225, such as heat lamps, to facilitate heating of the resist 203 either before or after exposure, e.g., to harden it. The patterning tool 220 may be a stepper with an alignment system 223 that moves the substrate 201 after exposing one die so that another portion of the substrate 201 may be exposed with the same exposure field 203.

The processing tool 220 may also be configured as a scanner. Scanners are steppers that increase the length of the exposure field 203 by moving the reticle 226 and stage 221 in opposite directions to each other during the exposure. Instead of exposing the entire field at once, the exposure is made through an "exposure slit" 224 that is as wide as the exposure field 205, but only a fraction of its length (e.g., a 8×26 mm slit for a 33×26 mm field is an industry standard). The image from the exposure slit 224 is scanned across the exposure area on the substrate 201.

By way of example, and without loss of generality, the processing tool 220 may also be configured as an electron beam lithography tool. Unlike the scanner and the stepper, an electron beam lithography tool is a direct write lithography system. A beam of electrons is directed across the substrate 201 covered with a resist without the need for a photomask. By way of example and without loss of generality, the processing tool 220 may also be a directed self-assembly (DSA) lithography tool. DSA utilizes natural processes such as preferred bonding orientations, within materials to produce ordered structures. Manipulation of these processes can be used to form stripes and can be fined tuned by altering the chemistry to achieve nanometric features.

The substrate 201 with the developed resist 203 may then be subject to further processing, e.g., etching or deposition. Such processes may take place in other processing tools not depicted in FIG. 2. Such tools may include spin-coaters, which deposit the resist on the substrate 201 or pre-bake chambers, in which the resist is heated prior to exposure or developing in the processing tool 220. By way of example, and without loss of generality, the other tools may include a deposition tool, an etch tool, an ion implant tool, a resist application tool, a resist stripping tool, a CMP tool, or the resist could be further cured and patterned for double patterned layers.

The controller 230 may include a central processor unit (CPU) 231 and a memory 232 (e.g., RAM, DRAM, ROM, and the like). The CPU 231 may execute a process-control program 233, portions of which may be stored in the memory 232. The memory may contain data 236 related to processes occurring in the tools 220 and/or metrology performed by either of the analysis tools 204, 210 on one or more substrates 201. The controller 230 may also include well-known support circuits 240, such as input/output (I/O) circuits 241, power supplies (P/S) 242, a clock (CLK) 243 and cache 244. The controller 230 may optionally include a mass storage device 234 such as a disk drive, CD-ROM drive, tape drive, or the like to store programs and/or data. The controller 230 may also optionally include a display unit 237 and user interface unit 238 to facilitate interaction between the controller 230 and a user. The display unit 237 may be in the form of a cathode ray tube (CRT) or flat panel screen that displays text, numerals, or graphical symbols. The user interface 238 may include a keyboard, mouse, joystick, light pen or other device. The preceding components may exchange signals with each other via an internal system bus 250. The controller 230 may be a general purpose computer that becomes a special purpose computer when running code that implements embodiments of the present invention as described herein.

By way of example, the controller 230 may be integrated into the pre-processing analysis tool 204. When integrated into the pre-processing analysis tool 204, the controller 230 may share components such as, but not limited to, the memory 232, support circuits 240, and CPU 231. Alternatively, the controller 230 may be integrated into the post-processing analysis tool 210. When integrated into the post-processing analysis tool 210, the controller 230 may share components such as, but not limited to, the memory 232, support circuits 240, and CPU 231. In an additional embodiment embodiment, the controller may be a stand-alone unit.

According to an embodiment of the present invention, the process-control program 233 may implement a process control loop in which substrate geometry data, acquired at a high spatial density across the substrate 201 is used to generate a sampling plan to be used by the post-processing analysis tool 210. The program 233 may use the substrate geometry data to identify the areas of the substrate with large changes in substrate geometry due to prior processing. By way of example, the substrate geometry data may represent the change in geometry between a previous layer and the current layer (i.e., the delta of two geometry measurements on the same substrate), or it may be an absolute measure of the geometry. The program 233 may then create a sampling plan which indicates that these areas need to be sampled at a higher density. The program 233 may then feed forward the sampling plan to the post-process analysis tool 210. After the substrate has been processed by the processing tool 220, the revised sampling plan may be executed by the post-process analysis tool 210 to detect overlay residual errors. Therefore, the samples taken of the overlay errors are focused in the regions of the substrate 201 that are most likely to contain higher overlay errors. By way of example, and not by way of limitation, program 233 may also utilize data generated from the post-process analysis tool 210 to generate higher order correctables which are then fed back to the processing tool 220 for use on subsequent substrates 201. The sampling densities in recent nodes have been increased by the need to calculate higher order correctables. Preferentially sampling areas with the largest substrate geometry changes decreases the sample size and therefore allows for greater throughput.

According to another embodiment of the present invention, the process-control program 233 may implement a process control loop in which substrate geometry data, acquired at a high spatial density across the substrate 201 is used to generate a lot sampling plan to be used by the post-processing analysis tool 210. By way of example, the substrate geometry data may represent the change in geometry between a previous layer and the current layer (i.e., the delta of two geometry measurements on the same substrate), or it may be an absolute measure of the geometry. The program 233 may use the substrate geometry data from several wafers to identify lots with large changes in substrate geometry due to prior processing. The program 233 may then create a lot sampling plan for inspection. Inspection steps typically sample every $N^{th}$ lot, but for substrates where there are significant wafer geometry changes, the inspection sampling strategy may change to more or less frequent lot sampling.

The program 233 may then feed forward the sampling plan to the post-process analysis tool 210. After the substrate has been processed by the processing tool 220, the revised lot sampling plan may be executed by the post-process analysis tool 210 to detect overlay errors. Therefore, the overlay target sampling is increased for the lots that are most likely to contain higher overlay errors. By way of example, and not by way of limitation, program 233 may also utilize data generated from the post-process analysis tool 210 to generate higher order correctables which are then fed back to the processing tool 220 for use on subsequent lots. Preferentially sampling lots with the largest substrate geometry changes decreases the sample size and therefore allows for greater throughput.

In an additional embodiment, the process-control program 233 may implement a process control loop in which substrate geometry data, acquired at a high spatial density across the substrate 201 is used to generate an alignment plan to be used by the processing tool 220. By way of example, the substrate geometry data may represent the change in geometry between a previous layer and the current layer (i.e., the delta of two geometry measurements on the same substrate), or it may be an absolute measure of the geometry. The program 233 may use the substrate geometry data to identify the areas of the substrate with the smallest or largest changes in substrate geometry due to prior processing. The program 233 may then create an alignment plan which indicates that these areas of minimal geometry change should be used as alignment locations. More likely, the alignment plan would use the areas with large geometry change to calculate better higher order correctables and improve product overlay performance. These locations are chosen because they minimize the number of adjustments required to be made by the processing tool 220 while aligning the substrate. The program 233 may then feed forward the alignment plan to the processing tool 220.

Figure 3:
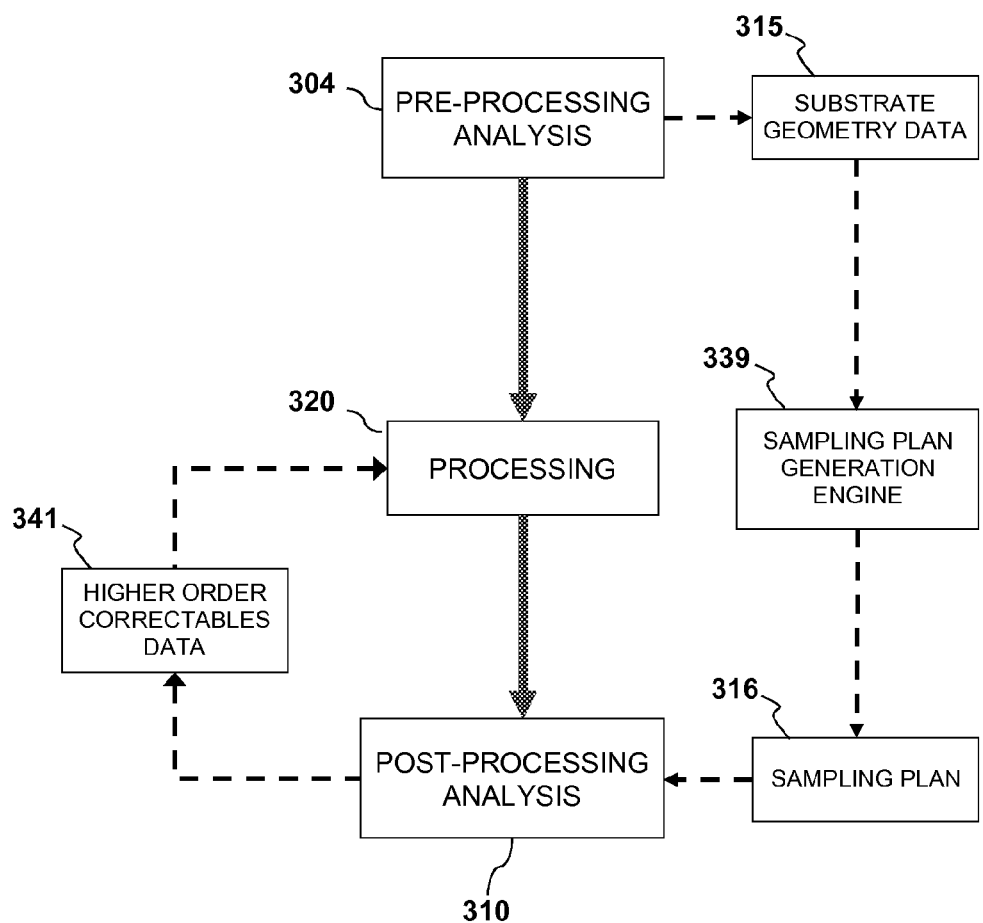
FIG. 3 is a flow diagram illustrating a method of process control in semiconductor wafer processing according to an embodiment of the present invention.

As illustrated in FIG. 3, the process-control program 233 may implement a method 300 for process control in the processing of a substrate 201. In FIG. 3 dashed arrows indicate flow of data, and solid arrows indicate flow of substrates 201. According to method 300, pre-process analysis 304 is performed on the substrate 201 in the pre-processing analysis tool 204. By way of example the pre-process analysis 304 may include interferometry or other suitable form of metrology capable of generating substrate geometry data 315. By way of example, but not by way of limitation, the substrate geometry data 315 may be a higher order shape characteristic such as site flatness, nanotopography, edge roll off, or warp. By way of example, the substrate geometry data 315 may represent the change in geometry between a previous layer and the current layer (i.e., the delta of two geometry measurements on the same substrate), or it may be an absolute measure of the geometry.

The substrate geometry data 315 is then used as an input for the sampling plan generation engine 339, which may be implemented as part of the program 233. Alternatively, the sampling plan generation engine 339 may be implemented wholly or partly in hardware. By way of example, the sampling plan generation module 339 may use the substrate geometry data 315 to generate the sampling plan 316 by identifying areas on the substrate 201 where the largest variations in substrate geometry are located and assigning more sampling locations 105 to these areas. By way of example, the sampling plan 316 may also be a lot sampling plan.

The sampling plan 316 may then be fed forward to the post-processing analysis tool 210. By way of example, the post-processing analysis tool 210 may be an overlay metrology tool or any other tool suitable to perform overlay residual error analysis. Alternatively, the post-processing analysis tool may be an inspection or review tool. Then the substrate 201 is delivered to the processing tool 220. Processing 320 of the substrate 201 occurs in the processing tool 220. By way of example the substrate 201 may be processed with a stepper. Alternatively, the processing 320 of the substrate 201 may be performed before or during the generation of the sampling plan 316. After processing 320, the substrate 201 is transported to the post-processing analysis tool 210. When the post-processing analysis tool 210 has both the processed substrate 201 and the sampling plan 316, then the post-processing tool 210 performs post-processing analysis 310 on the substrate 201 as directed by the sampling plan 316. By way of example, and not by way of limitation, if post-processing tool 210 is an overlay tool and if the overlay errors are within a predetermined threshold then the substrate 201 may be approved for continued processing. If the overlay residual errors are not within the predetermined threshold, the substrate may be identified as needing rework or it may be scrapped. The post-processing analysis tool 210 may generate higher order correctables 341 based in its analysis of the dies in the sampling plan 316. The higher order correctables 341 are fed back to the processing tool 220 for use on subsequent substrates.

In an embodiment of the present invention, the controller 230 may be integrated into the pre-processing analysis tool 204 or the post-processing analysis tool 210. The controller may also be a standalone device, e.g., a general-purpose computer that is separate from analysis tools 204, 210. The substrate geometry data 315 from substrate 201 may be stored in a memory 232 shared between the pre-processing analysis tool 204 and the controller 230. The controller 230 may access the substrate geometry data 315 from the memory 232 and use it as in input for the sampling plan generation engine 339. Once the sampling plan 316 has been generated, the controller may send the sampling plan 316 to the post-processing analysis tool 210. By way of example and not by way of limitation, the post-processing analysis tool 210 may store the sampling plan 316 in an internal memory such that it can be accessed by the post-processing analysis tool 210 when the corresponding substrate 201 is ready to be sampled.

In an additional embodiment of the present invention, the controller 230 may be integrated into the post-processing analysis tool 210. The controller 230 may retrieve the substrate geometry data 315 from the pre-processing analysis tool 204. By way of example and not by way of limitation, the pre-processing analysis tool 204 may store the substrate geometry data 315 in an internal memory. The controller 230 may utilize the substrate geometry data 315 as an input for the sampling plan generation engine 339 in order to create the sampling plan 316. By way of example and not by way of limitation, the sampling plan 316 may be stored in a memory 232 shared between the controller 230 and the post-processing analysis tool 210. The post-processing analysis tool 210 may access the stored sampling plan 316 once it is required to test the corresponding substrate 201.

In embodiments of the present invention, some or all of the substrates 201 processed by the processing tool 220 may have a unique sampling plan 316 generated for each substrate 201. For example, a unique sampling plan 316 may be generated for 100% of the substrates 201. Alternatively, a unique sampling plan 316 may be generated for only selected subsets of the substrates 201. If a single process tool (or single process chamber on a specific tool) has a repeatable signature of substrate distortion, it may be sufficient to measure one substrate per lot from that tool (or chamber) or one wafer per several lots for substrate geometry data 315. In this case the sampling plan 316 generated from the substrate geometry data 315 may be used by the post-processing analysis tool 310 for sampling each substrate from the same lot. In some cases, a tool may have more than one chuck and each chuck may have a different signature.

Figure 4:
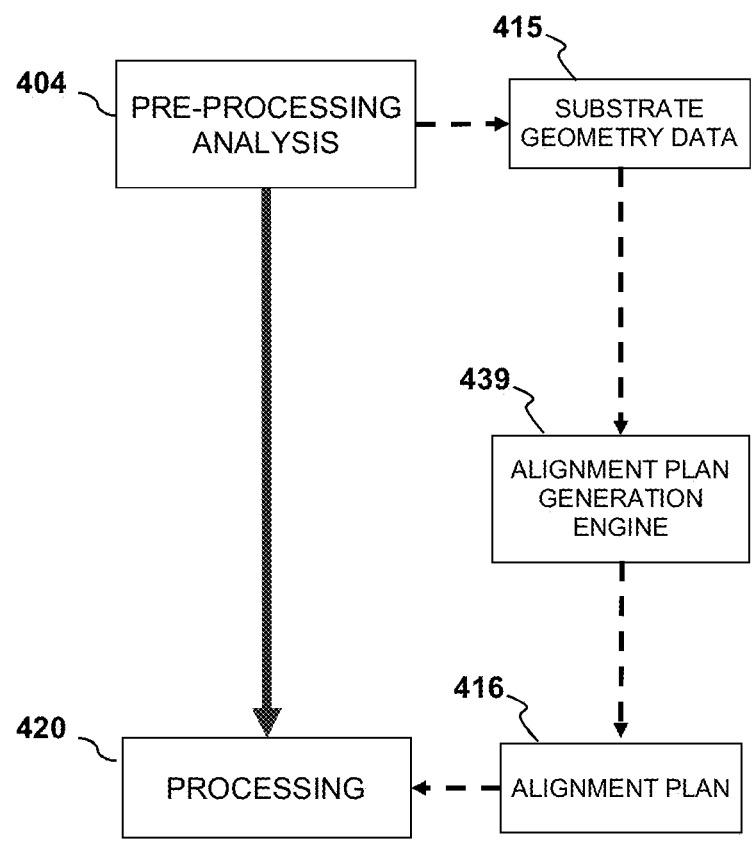
FIG. 4 is a flow diagram illustrating a method of process control in a semiconductor wafer according to an additional embodiment of the present invention.

As illustrated in FIG. 4, the process-control program 233 may implement a method 400 for process control in the processing of a substrate 201. In FIG. 4 dashed arrows indicate flow of data, and solid arrows indicate flow of substrates 201. According to method 400, pre-process analysis 404 is performed on the substrate 201 in the pre-processing analysis tool 204. By way of example the pre-process analysis 404 may include interferometry or other suitable form of metrology capable of generating substrate geometry data 415. By way of example, but not by way of limitation, the substrate geometry data 415 may be a higher order shape characteristic such as site flatness, nanotopography, edge roll off, or warp. By way of example, the substrate geometry data 415 may represent the change in geometry between a previous layer and the current layer (i.e., the delta of two geometry measurements on the same substrate), or it may be an absolute measure of the geometry.

The substrate geometry data 415 is then used as an input for the alignment plan generation engine 439, which may be implemented as part of the program 233. Alternatively, the alignment plan generation engine 439 may be implemented wholly or partly in hardware. By way of example, the alignment plan generation module 439 may use the substrate geometry data 415 to generate the alignment plan 416 by identifying areas on the substrate 201 where the smallest variations in substrate geometry are located and assigning more alignment locations to these areas.

The alignment plan 416 may then be fed forward to the processing tool 220. By way of example, the processing tool 210 may be a stepper. Then the substrate 201 is delivered to the processing tool 220. Processing 420 of the substrate 201 includes aligning the substrate according to alignment plan 416.

In an embodiment of the present invention, the controller 230 may be integrated into the pre-processing analysis tool 204 or the processing tool 220. The controller may also be a standalone device, e.g., a general-purpose computer that is separate from analysis tools 204, 220. The substrate geometry data 415 from substrate 201 may be stored in a memory 232 shared between the pre-processing analysis tool 204 and the controller 230. The controller 230 may access the substrate geometry data 415 from the memory 232 and use it as in input for the alignment plan generation engine 439. Once the alignment plan 416 has been generated, the controller may send the alignment plan 416 to the processing tool 220. By way of example and not by way of limitation, the processing tool 220 may store the alignment plan 416 in an internal memory such that it can be accessed by the processing tool 220 when the corresponding substrate 201 is ready to be aligned.

In an additional embodiment of the present invention, the controller 230 may be integrated into the processing tool 220. The controller 220 may retrieve the substrate geometry data 415 from the pre-processing analysis tool 204. By way of example and not by way of limitation, the pre-processing analysis tool 204 may store the substrate geometry data 415 in an internal memory. The controller 230 may utilize the substrate geometry data 415 as an input for the alignment plan generation engine 439 in order to create the alignment plan 416. By way of example and not by way of limitation, the alignment plan 416 may be stored in a memory 232 shared between the controller 230 and the processing tool 220. The processing tool 210 may access the stored alignment plan 416 once it is required to align the corresponding substrate 201.

In embodiments of the present invention, some or all of the substrates 201 processed by the processing tool 220 may have a unique alignment plan 416 generated for each substrate 201. For example, a unique alignment plan 416 may be generated for 100% of the substrates 201. Alternatively, a unique alignment plan 416 may be generated for only selected subsets of the substrates 201. If a single process tool (or single process chamber on a specific tool) has a repeatable signature of substrate distortion, it may be sufficient to measure one substrate per lot from that tool (or chamber) or one wafer per several lots for substrate geometry data 415. In this case the alignment plan 416 generated from the substrate geometry data 415 may be used by the processing tool 220 for aligning each substrate from the same lot. In some cases, a tool may have more than one chuck and each chuck may have a different signature.

Additional Aspects

According to a first additional aspect, a method for process control in processing a plurality of lots of substrates, may include: a) generating a lot sampling plan wherein a lot sampling frequency is determined by changes in substrate geometry information derived from one or more analyses of one or more of the substrates within a first lot of substrates, performed with a first analysis tool before a fabrication process is performed on the first lot of substrates; and b) feeding forward the lot sampling plan to a second analysis tool so that the second analysis tool can sample the plurality of lots of substrates according to the lot sampling plan after the fabrication process is performed on the plurality of lots of substrates with a process tool.

In the method of the first additional aspect, the first analysis tool may be configured to perform interferometry, ellipsometry, capacitance based metrology, or optical focus.

In the method of the first additional aspect, the one or more analyses that are performed with the first analysis tool may be performed over an entire surface of the one or more of the substrates within the first lot of substrates.

In the method of the first additional aspect the substrate geometry information may include higher order shape, site flatness, nanotopography, localized features, or edge roll off.

In the method of the first additional aspect the substrate geometry information may be a change in geometry between a previously processed layer of the one or more of the substrates within the first lot of substrates and a layer of the one or more of the substrates within the first lot of substrates that will be processed.

In the method of the first additional aspect the substrate geometry information may be in a form that can be used to generate a topographical map of the one or more of the substrates within the first lot of substrates.

In the method of the first additional aspect the fabrication process performed on the plurality of lots of substrates is a lithography process. In such a case, the process tool may include a scanner, stepper, electron beam lithography tool, or directed self-assembly tool.

In the method of the first additional aspect the fabrication process may be a polishing process. In such a case, the polishing process may include chemical mechanical planarization.

In the method of the first additional aspect the second analysis tool may be configured to perform overlay, critical dimension, scatterometry, optical microscopy, or scanning electron microscopy.

In the method of the first additional aspect the fabrication process takes place before generating the lot sampling plan.

In the method of the first additional aspect the fabrication process may take place before feeding forward the lot sampling plan to the second analysis tool.

In the method of the first additional aspect the fabrication process may take place at while generating the lot sampling plan or feeding forward the lot sampling plan to the second analysis tool.

In the method of the first additional aspect generating the lot sampling plan may include receiving geometry information for the one or more of the substrates within the first lot of substrates derived from the one or more analyses performed with the first analysis tool at a controller and generating the lot sampling plan with the controller. In such a case, the controller may be part of the first analysis tool.

In the method of the first additional aspect feeding forward the lot sampling plan may include sending the lot sampling plan directly to a controller associated with the second analysis tool. In such a case, feeding forward the lot sampling plan may include sending the lot sampling plan indirectly to a controller associated with the second analysis tool via another controller. The controller may be part of the second analysis tool. The sampling plan may be sent from a part of the controller to a part of the analysis tool.

Another additional aspect (A) includes a method for process control in processing a substrate, comprising:
a) generating an alignment plan wherein a plurality of alignment locations on the substrate are determined by changes in substrate geometry information for the substrate derived from one or more analyses of the substrate performed with a first analysis tool before a fabrication process is performed on the substrate; and b) feeding forward the alignment plan to a process tool so that the process tool can implement the alignment plan before processing the substrate.

An additional aspect (B) includes the method of aspect A, wherein the first analysis tool is configured to perform interferometry, ellipsometry, capacitance based metrology, or optical focus.

An additional aspect (C) includes the method of aspect A, wherein the one or more analyses performed with the first analysis tool are performed over an entire surface of the substrate.

An additional aspect (D) includes the method of aspect A, wherein the substrate geometry information includes higher order shape, site flatness, nanotopography, localized features, or edge roll off.

An additional aspect (E) includes the method of aspect A, wherein the substrate geometry information is the change in geometry between a previously processed layer of the substrate and a layer of the substrate that will be processed.

An additional aspect (F) includes the method of aspect A, wherein the substrate geometry information is in a form that can be used to generate a topographical map of the substrate.

An additional aspect (G) includes the method of aspect A, wherein the fabrication process performed on the substrate is a lithography process.

An additional aspect (H) includes the method of aspect G, wherein the process tool includes a scanner, stepper, electron beam lithography tool, or directed self-assembly tool.

An additional aspect (I) includes the method of aspect A, wherein the fabrication process is a polishing process.

An additional aspect (J) includes the method of aspect I, wherein the polishing process includes chemical mechanical planarization.

An additional aspect (K) includes the method of aspect A wherein the fabrication process takes place before feeding forward the sampling plan to the second analysis tool.

An additional aspect (L) includes the method of aspect A, wherein generating the sampling plan includes receiving geometry information for the substrate derived from one or more analyses performed with the first analysis tool at a controller and generating the sampling plan with the controller.

An additional aspect (M) includes the method of aspect L, wherein the controller is part of the first analysis tool.

An additional aspect (N) includes the method of aspect L, wherein feeding forward the sampling plan includes sending the sampling plan indirectly to a controller associated with the second analysis tool via another controller.

All of the foregoing aspects may be implemented by a suitably configured apparatus or nontransitory computable readable medium encoded with suitably configured computer readable instructions.

By way of example, the apparatus may include a controller than can be coupled to a first analysis tool or a process tool. The controller can be configured to a) generate an alignment plan wherein a plurality of alignment locations on the substrate are determined by changes in substrate geometry information for the substrate derived from one or more analyses of the substrate performed with a first analysis tool before a fabrication process is performed on the substrate; and b) feed forward the alignment plan to a process tool so that the process tool can implement the alignment plan before processing the substrate.

Alternatively, the apparatus may include a controller than can be coupled to a first or second analysis tool. The controller may be configured to a) generate a lot sampling plan wherein a lot sampling frequency is determined by changes in substrate geometry information derived from one or more analyses of one or more of the substrates within a first lot of substrates, performed with a first analysis tool before a fabrication process is performed on the first lot of substrates; and b) feed forward the lot sampling plan to a second analysis tool so that the second analysis tool can sample the plurality of lots of substrates according to the lot sampling plan after the fabrication process is performed on the plurality of lots of substrates with a process tool.

By way of example, the nontransitory computer readable medium containing program instructions for performing process control in processing a substrate, wherein execution of the program instructions by one or more processors of a computer system causes the one or more processors to carry out method including a) generating an alignment plan wherein a plurality of alignment locations on the substrate are determined by changes in substrate geometry information for the substrate derived from one or more analyses of the substrate performed with a first analysis tool before a fabrication process is performed on the substrate; and b) feeding forward the alignment plan to a process tool so that the process tool can implement the alignment plan before processing the substrate.

Alternatively, the nontransitory computer readable medium may contain program instructions for performing process control in processing a substrate, wherein execution of the program instructions by one or more processors of a computer system causes the one or more processors to carry out a method including a) generating a lot sampling plan wherein a lot sampling frequency is determined by changes in substrate geometry information derived from one or more analyses of one or more of the substrates within a first lot of substrates, performed with a first analysis tool before a fabrication process is performed on the first lot of substrates; and b) feeding forward the lot sampling plan to a second analysis tool so that the second analysis tool can sample the plurality of lots of substrates according to the lot sampling plan after the fabrication process is performed on the plurality of lots of substrates with a process tool.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for process control in processing a substrate, comprising:
   a) generating a sampling plan, the sampling plan defining which areas of the substrate to sample and the sampling plan having a sampling density of an area on the substrate that is determined by changes in substrate geometry information for the substrate, the changes in the substrate geometry information being derived from one or more analyses of the substrate performed using measurements of a preprocess substrate geometry obtained with a first analysis tool before a fabrication process is performed on the substrate, wherein the changes in substrate geometry information for the substrate include a delta of two geometry measurements on the substrate, wherein the preprocess substrate geometry includes a determination of at least site flatness or warp of the substrate itself; and
   b) feeding forward the sampling plan to a second analysis tool that samples the areas of the substrate defined by the sampling plan after the fabrication process is performed on the substrate with a process tool.

2. The method of claim 1 wherein the first analysis tool is configured to perform interferometry, ellipsometry, capacitance based metrology, or optical focus.

3. The method of claim 1 wherein the one or more analyses performed with the first analysis tool are performed over an entire surface of the substrate.

4. The method of claim 1 wherein the substrate geometry information includes higher order shape, site flatness, nanotopography, localized features, or edge roll off.

5. The method of claim 1 wherein the substrate geometry information is the change in geometry between a previously processed layer of the substrate and a layer of the substrate that will be processed.

6. The method of claim 1 wherein the substrate geometry information is formatted to be used to generate a topographical map of the substrate.

7. The method of claim 1 wherein the fabrication process performed on the substrate is a lithography process.

8. The method of claim 7 wherein the process tool includes a scanner, stepper, electron beam lithography tool, or directed self-assembly tool.

9. The method of claim 1 wherein the fabrication process is a polishing process.

10. The method of claim 9 wherein the polishing process includes chemical mechanical planarization.

11. The method of claim 1 wherein the second analysis tool is configured to perform overlay, critical dimension, scatterometry, optical microscopy, or scanning electron microscopy.

12. The method of claim 1 wherein the fabrication process takes place before generating the sampling plan.

13. The method of claim 1 wherein the fabrication process takes place before feeding forward the sampling plan to the second analysis tool.

14. The method of claim 1 wherein the fabrication process takes place while generating the sampling plan or feeding forward the sampling plan to the second analysis tool.

15. The method of claim 1, wherein generating the sampling plan includes receiving geometry information for the substrate derived from one or more analyses performed with the first analysis tool at a controller and generating the sampling plan with the controller.

16. The method of claim 15, wherein the controller is part of the first analysis tool.

17. The method of claim 16, wherein feeding forward the sampling plan includes sending the sampling plan directly to a controller associated with the second analysis tool.

18. The method of claim 16, wherein feeding forward the sampling plan includes sending the sampling plan indirectly to a controller associated with the second analysis tool via another controller.

19. The method of claim 15, wherein the controller is part of the second analysis tool.

20. The method of claim 19, wherein feeding forward the sampling plan includes sending the sampling plan from a part of the controller to a part of the second analysis tool.

21. The method of claim 15, wherein the controller is not part of the first or second analysis tool.

22. The method of claim 1, wherein the first or second analysis tool is configured to hold the substrate vertically.

23. The method of claim 22, wherein the first or second analysis tool is configured to perform interferometry on front and back sides of the substrate at the same time.

24. An apparatus for performing process control in processing a substrate, comprising:
    a controller coupled to a first and second analysis tool, wherein the controller is configured to:
    retrieve preprocess substrate geometry data generated from measurements of the substrate obtained using the first analysis tool before a fabrication process is performed on the substrate by a process tool wherein the preprocess substrate geometry includes a determination of at least site flatness or warp of the substrate itself;
    generate a sampling plan, the sampling plan defining which areas of the substrate to sample and the sampling plan having a sampling density of an area on the substrate that is determined by changes in the substrate geometry data and preprocess substrate geometry, wherein the changes in substrate geometry information for the substrate include a delta of two geometry measurements on the substrate; and
    feed forward the sampling plan to the second analysis tool so that the second analysis tool can sample the areas of the substrate defined by the sampling plan after the fabrication process is performed on the substrate with the process tool.

25. The apparatus of claim 24 wherein controller is part of the first analysis tool.

26. The apparatus of claim 24, wherein the controller is part of the second analysis tool.

27. The apparatus of claim 24, wherein the controller is separate from the analysis or review tools.

28. The apparatus of claim 24, wherein the metrology performed by the first analysis tool includes interferometry, ellipsometry or capacitance based metrology.

29. The apparatus of claim 24 wherein substrate geometry data includes higher order shape, site flatness, nanotopography, localized features, or edge roll off.

30. The apparatus of claim 24 wherein the substrate geometry information is in a form that can be used to generate a topographical map of the substrate.

31. The apparatus of claim 24 wherein the processing tool is a lithography tool.

32. The apparatus of claim 31 wherein the lithography tool includes a scanner, stepper, electron beam lithography tool, or directed self-assembly tool.

33. The apparatus of claim 24 wherein the processing tool is a polishing tool.

34. The apparatus of claim 33 wherein the polishing tool includes a chemical mechanical polishing tool.

35. The apparatus of claim 24 wherein the one or more analyses performed by the second analysis tool includes, overlay, critical dimension, scatterometry, optical microscopy, or scanning electron microscopy.

36. The apparatus of claim 24, wherein the first or second analysis tool is configured to hold the substrate vertically.

37. The apparatus of claim 36, wherein the first or second analysis tool is configured to perform interferometry on front and back sides of the substrate at the same time.

38. A nontransitory computer readable medium containing program instructions for performing process control in processing a substrate, wherein execution of the program instructions by one or more processors of a computer system causes the one or more processors to carry out method for process control in processing a substrate, the method comprising:
a) generating a sampling plan, the sampling plan defining which areas of the substrate to sample and the sampling plan having a sampling density of an area on the substrate that is determined by changes in geometry information for the substrate, the changes in substrate geometry information being derived from one or more analyses performed using measurements of a preprocess substrate geometry obtained with a first analysis tool before a fabrication process is performed on the substrate, wherein the changes in substrate geometry information for the substrate include a delta of two geometry measurements on the substrate, wherein the preprocess substrate geometry includes a determination of at least site flatness or warp of the substrate itself; and
b) feeding forward the sampling plan to a second analysis tool so that samples the areas of the substrate defined by the sampling plan after the fabrication process is performed on the substrate with a process tool.

* * * * *